(12) United States Patent
Yamamoto

(10) Patent No.: US 6,573,949 B1
(45) Date of Patent: Jun. 3, 2003

(54) TELEVISION SIGNAL RECEIVING TUNER WITH FREQUENCY-MODULATION BROADCAST-BAND ATTENUATION CIRCUIT

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/550,756

(22) Filed: Apr. 17, 2000

(30) Foreign Application Priority Data

Apr. 20, 1999 (JP) ............................. 11-111778

(51) Int. Cl.[7] .................................................. H04N 5/50
(52) U.S. Cl. ..................... 348/731; 348/729; 348/733
(58) Field of Search ............................. 348/739, 725, 348/729, 733, 736, 738; 455/179.1, 180.2, 180.4, 182.3; H04N 5/44, 5/46, 5/50

(56) References Cited

U.S. PATENT DOCUMENTS 4,835,608 A  *  5/1989  Lachiw et al. ............. 348/733
5,963,842 A  *  10/1999  Kinugawa ................... 455/3.2
6,108,050 A  *  8/2000  Yamamoto et al. ......... 348/731
6,342,928 B1 *  1/2002  Ohira ......................... 348/729
6,344,881 B1 *  2/2002  Endo .......................... 348/729
6,351,294 B1 *  2/2002  Yamamoto et al. ......... 348/731

FOREIGN PATENT DOCUMENTS

JP  11-205699  10/1998
JP  11-243348  10/1998

* cited by examiner

*Primary Examiner*—John Miller
*Assistant Examiner*—Trang U. Tran
(74) *Attorney, Agent, or Firm*—Brinks Hofer Gilson & Lione

(57) ABSTRACT

A television signal receiving tuner that is capable of receiving at least terrestrial television broadcast signals includes a trap circuit for attenuating frequency-modulation broadcast-band signals. The trap circuit attenuates frequency-modulation broadcast-band signals that are in proximity to the desired terrestrial television broadcast signals or are broadcast within a band that are received at one half of the frequency of the desired terrestrial television broadcast signals.

16 Claims, 3 Drawing Sheets

TELEVISION SIGNAL RECEIVING TUNER WITH FREQUENCY-MODULATION BROADCAST-BAND ATTENUATION CIRCUIT

BACKGROUND OF THE INVENTION

1. Field of the Invention

The present invention relates to television signal receiving tuners, and more particularly relates to a television signal receiving tuner that is capable of receiving terrestrial television broadcasts and that has a trap circuit for attenuating frequency-modulation broadcast-band signals.

2. Description of the Related Art

A conventional television signal receiving tuner (hereinafter referred to as simply a tuner) is shown in FIG. 3. In the tuner shown in FIG. 3, one terminal 31a of of a filter 31 is connected to an antenna for receiving a terrestrial television broadcast or a cable for receiving cable television (CATV) signals (neither are shown). Another end 31b of the filter 31 is connected to an input terminal of a VHF (very high frequency) unit 32 and that of a UHF (ultrahigh frequency) unit 33 which are connected in parallel with each other. An output terminal of the VHF unit 32 and an output terminal of the UHF unit 33 are each connected to an integrated circuit 34. The integrated circuit 34 has a mixer, an oscillator, and a PLL (phase locked loop) incorporated therein. The mixer frequency-converts a high frequency signal in the VHF band or in the UHF band into an intermediate frequency signal IF and outputs the intermediate frequency signal IF.

The VHF unit 32 is constructed by sequentially connecting in series a trap circuit 35, a VHF antenna tuning circuit 36, a VHF high frequency amplifier 37 and a VHF interstage tuning circuit 38. Likewise, the UHF unit 33 is constructed by sequentially connecting in series a UHF antenna tuning circuit 39, a UHF high frequency amplifier 40, and a UHF interstage tuning circuit 41.

The trap circuit 35 attenuates FM broadcast signals which interfere with terrestrial television broadcast signals when terrestrial television broadcast signals are received. A parallel resonant circuit constructed with an inductor 42 and a capacitor 43 is connected, via a direct current blocking capacitor 44, in parallel with a switch diode 45, the cathode of which is connected to an input terminal 35a of the trap circuit 35 and the anode is connected to an output terminal 35b thereof. The resonant frequency of the parallel resonant circuit formed by the inductor 42 and the capacitor 43 is set within the FM broadcast-band. The cathode of the switch diode 45 is grounded via a resistor 46 which is provided between the input terminal 35a ground. A trap circuit control voltage $V_f$ is applied via a feeding resistor 47 from the integrated circuit 34 to a node between the switch diode 45 and the resistor 46.

In the VHF unit 32, the VHF antenna tuning circuit 36 outputs a desired VHF band television signal to the VHF high frequency amplifier 37. The VHF high frequency amplifier 37 amplifies the input television signal, and the VHF interstage tuning circuit 38 outputs the amplified television signal to the integrated circuit 34. Operations of the circuits that comprise the UHF unit 33 are the same as those circuits described in the VHF unit 32. Therefore, descriptions of the UHF circuits are omitted.

The integrated circuit 34 outputs a band selection voltage or a tuning voltage in accordance with channel selection data DA input from a television receiver (not shown). The band selection voltage consists of a voltage $V_{lo}$ for selecting a low band in the VHF band, a voltage $V_{hi}$ for selecting a high band in the VHF band, and a voltage $V_u$ for selecting the UHF band. When each band is selected, the integrated circuit 34 outputs a voltage of 5 V. The band selection voltages $V_{lo}$ and $V_{hi}$ for the VHF band are applied to the VHF antenna tuning circuit 36, the VHF high frequency amplifier 37, and the VHF interstage tuning circuit 38. The band selection voltage $V_u$ for the UHF band is applied to the UHF high frequency amplifier 40. A tuning voltage $V_t$ is applied to the VHF antenna tuning circuit 36, the VHF interstage tuning circuit 38, the UHF antenna tuning circuit 39, and the UHF interstage tuning circuit 41.

For example, in the United States frequency assignments for VHF and UHF band television channels and the FM broadcast-band are shown in Table 1. It should be noticed that the frequency band assigned to channel six is adjacent to that of the FM broadcasting range.

Furthermore, some CATV channels are assigned to the FM broadcast-band (for example, in the United States, between 88 MHz and 108 MHz). Accordingly, the trap circuit 35 is activated when signals for channel six or for particular CATV channels are received; otherwise the trap circuit 35 is not activated.

TABLE 1

| Band | | Ch. No. | Freq. Band (MHz) | $V_f$ | Att. Freq. (MHz) |
|---|---|---|---|---|---|
| Terrestrial Television Broadcasting | VHF Low Band | 2 to 5 | 54 to 82 | OFF | — |
| | | 6 | 82 to 88 | ON | 91.25 |
| | VHF High Band | 7 to 13 | 174 to 216 | OFF | — |
| | UHF | 14 to 83 | 470 to 890 | OFF | — |
| Cable TV | VHF Low Band | 2 to 6 | 54 to 88 | OFF | |
| | Midband | A-5 to 1 | 90 to 174 | OFF | — |
| | VHF High Band | 7 to 13 | 174 to 216 | OFF | |
| | Superband | J to W | 216 to 300 | OFF | — |
| | Hyperband | W + 1 to W + 58 | 300 to 648 | OFF | — |
| | FM | — | 88 to 108 | — | — |

When signals having frequencies within the terrestrial television broadcasting channel six are received, the trap circuit control voltage $V_f$, (e.g., a 5 V voltage), is applied via the feeding resistor 47 from the integrated circuit 34 to the trap circuit 35. Since the switch diode 45 is reverse-biased, the switch diode 45 is switched off. With the switched diode 45 switched off, the trap circuit 35 attenuates a signal having a particular frequency, such as 91.25 MHz within the FM broadcast-band, which is in the proximity of the frequency band of channel six.

When the terrestrial television broadcast VHF low band, apart from the band of channel six, or VHF high band is received, the trap circuit control voltage $V_f$ is not applied to the trap circuit 35 and the band selection voltage $V_{hi}$ or $V_{lo}$ is applied to the VHF antenna tuning circuit 36. Since the switch diode 45 is forward-biased, the switch diode 45 is switched on. With the switch diode 45 switched on, the input terminal 35a and the output terminal 35b of the trap circuit 35 are short-circuited, allowing high frequency signals to be received by the VHF antenna tuning circuit 36 without being attenuated by the trap circuit 35.

When CATV signals are received, the trap circuit control voltage $V_f$ is not applied to the trap circuit 35 and the band selection voltage $V_{hi}$ or $V_{lo}$ is applied to the VHF antenna tuning circuit 36. Since the switch diode 45 is forward-biased, the switch diode 45 is switched on. With the switch diode 45 switched on, the input terminal 35a and the output terminal 35b of the trap circuit 35 are short-circuited, and the CATV signals within the entire VHF band are received by the VHF antenna tuning circuit 36 without being attenuated by the trap circuit 35.

When the above-described conventional tuner receives VHF television signals within the terrestrial television broadcast-band, the integrity of the VHF television signals can be impaired. The frequencies of some of these received signals correspond to twice the frequencies of the FM broadcast-band (between 88 MHz and 108 MHz). It is the second harmonic of these FM broadcast signals that can also interfere with the television signals received by the high frequency amplifier 37 and other components. The quality of the received image is thus degraded if the second harmonic of these FM broadcast signals is not removed.

SUMMARY OF THE INVENTION

According to a first aspect of the invention, a television signal tuner capable of receiving at least terrestrial television broadcast signals is provided. The television signal receiving tuner includes a trap circuit for attenuating frequency-modulation (FM) broadcast-band signals that interfere with the terrestrial television broadcast signals. The trap circuit passes select terrestrial television signals while attenuating (or dampening) FM broadcast-band signals that are in proximity to the selected terrestrial television signals, or have frequencies that when doubled coincide with the selected terrestrial television signals. By suppressing interference from adjacent FM broadcast signals and from second harmonics generated from some other FM broadcast signals, degradation in the quality of received images can be minimized.

In a tuner, the attenuated frequency or resonate frequency of the trap circuit changes when with the desired television channel changes. When the desired channel has a frequency that is double the frequency of a FM broadcast-band, second harmonic interference can effect signal quality. Under this condition, suppression of the interference caused by second harmonics of FM broadcast signals can be ensured, which prevents degradation in the quality of the received television images.

The tuner may further include a varactor diode. In one preferred embodiment, the resonant frequency or attenuated frequency of the trap filter may be varied by applying a tuning voltage to the varactor diode that corresponds to the desired channel of frequencies to be received. By changing the reception channel, the resonant frequency or attenuated frequency of the trap filter is changed and the range of interference can be minimized.

In one preferred embodiment, the trap circuit may include a parallel resonant circuit, a switch diode, and a varactor diode in which the parallel resonant circuit, the switch diode, and the varactor diode are connected in parallel with one another. When the desired television signals are in proximity to the FM broadcast-band or the signals are approximately double the frequencies of a FM broadcast-band signal, the switch diode is reversed biased or switched off, and when other television signals are received, the switch diode is forward biased or switched on.

When CATV signals are received, the CATV signals are received without being attenuated by the trap circuit.

DESCRIPTION OF THE PREFERRED EMBODIMENT

Figure 1:
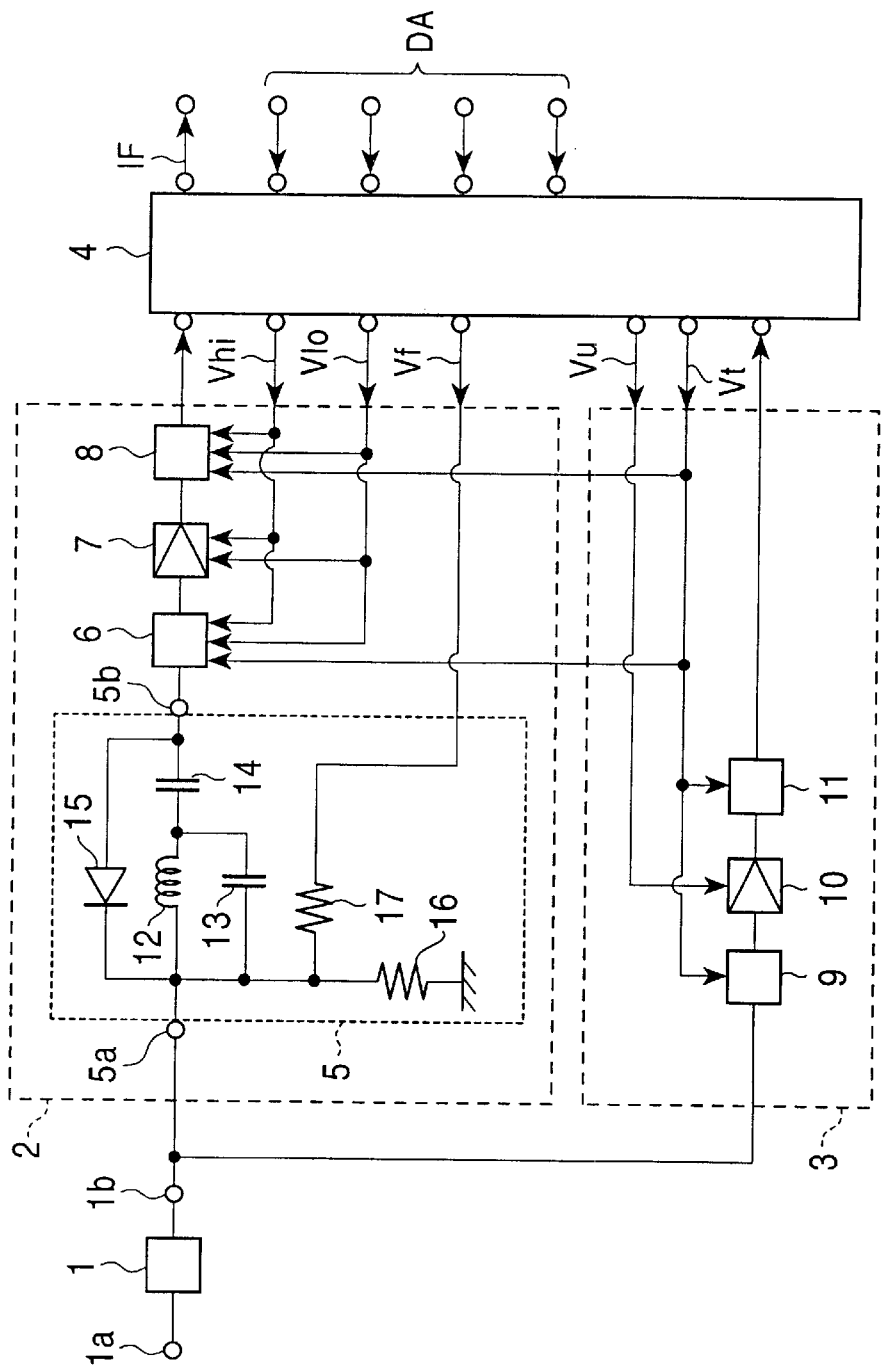
FIG. 1 is a block diagram of a television signal receiving tuner according to the present invention.

FIG. 1 illustrates a block diagram of the television signal receiving tuner according to a preferred embodiment of the present invention. In the tuner of FIG. 1, one terminal 1a of a filter 1 is connected to an antenna for receiving terrestrial television broadcasts or a cable for receiving CATV signals (neither are shown). Another end 1b of the filter 1 is connected to the input terminal of a VHF unit 2 and that of a UHF unit 3 which are connected in parallel with each other. An output terminal of the VHF unit 2 and an output terminal of the UHF unit 3 are each connected to an integrated circuit 4. The integrated circuit 4 has a mixer, an oscillator, and a PLL incorporated therein. The mixer frequency-converts a high frequency signal in the VHF band or an ultra-high frequency in the UHF band into an intermediate frequency signal IF and outputs the intermediate frequency signal IF.

The VHF unit 2 is constructed by sequentially connecting in series a trap circuit 5, a VHF antenna tuning circuit 6, a VHF high frequency amplifier 7, and a VHF interstage tuning circuit 8. Likewise, the UHF unit 3 is constructed by sequentially connecting in series a UHF antenna tuning circuit 9, a UHF high frequency amplifier 10, and a UHF interstage tuning circuit 11.

The trap circuit 5 attenuates FM broadcast signals which interfere with terrestrial television broadcast signals when terrestrial television broadcast signals are received. A parallel resonant circuit formed by an inductor 12 and a first capacitor 13 is coupled, via a direct current blocking capacitor 14, in parallel with a switch diode 15, the cathode of which is connected to an input terminal 5a of the trap circuit 5 and the anode is connected to an output terminal 5b thereof. The resonant frequency of the parallel circuit formed by the inductor 12 and the first capacitor 13 is set within the FM broadcast-band. The cathode of the switch diode 15 is grounded via a resistor 16 provided between the input terminal 5a and ground. A trap circuit control voltage $V_f$ is applied via a first feeding resistor 17 from the integrated circuit 4 to a node between the switch diode 15 and the resistor 16.

In the VHF unit 2, the VHF antenna tuning circuit 6 outputs a desired VHF band television signal to be received by the VHF high frequency amplifier 7, the VHF high frequency amplifier 7 amplifies the input television signal, and the VHF interstage tuning circuit 8 outputs the amplified television signal to the integrated circuit 4. Operations of the circuits of the UHF unit 3 are similar to those described in the VHF unit 2. Therefore, descriptions of the circuits that comprise UHF Unit 3 are omitted.

The integrated circuit 4 outputs a band selection voltage and a tuning voltage in accordance with channel selection data DA input from a television receiver (not shown). The band selection voltage consists of a voltage $V_{lo}$ for selecting a low band in the VHF band, a voltage $V_{hi}$ for selecting a high band in the VHF band, and a voltage $V_u$ for selecting the UHF band. When a band is selected, the integrated circuit 4 outputs a voltage, for example, a 5 V voltage. The VHF band selection voltage $V_{lo}$ or $V_{hi}$ is applied to the VHF antenna tuning circuit 6, the VHF high frequency amplifier 7, and the VHF interstage tuning circuit 8. The UHF band selection voltage $V_u$ is applied to the UHF high frequency amplifier 10. A tuning voltage $V_t$ is applied to the VHF antenna tuning circuit 6, the VHF interstage tuning circuit 8, the UHF antenna tuning circuit 9, and the UHF interstage tuning circuit 11.

For example, in the United States frequency assignments of VHF and UHF band television channels and the FM broadcast-band are shown in Table 2. It should be noted that the frequency band of channel six (between 82 MHz and 88 MHz) is adjacent to the FM broadcasting frequency band (between 88 MHz and 108 MHz). Furthermore, some CATV channels are assigned within the FM broadcast-band (for example, in the United States, between 88 MHz and 108 MHz).

Accordingly, FM broadcast signals are attenuated by the trap circuit 5 when signals for channel six or for particular CATV channels are received; otherwise the trap circuit 5 is not activated.

TABLE 2

| | Band | Ch. No. | Freq. Band (MHZ) | $V_f$ | Att. Freq. (MHz) |
|---|---|---|---|---|---|
| Terrestrial Television Broadcasting | VHF Low Band | 2 to 5 | 54 to 82 | OFF | — |
| | | 6 | 82 to 88 | ON | 91.25 |
| | VHF High Band | 7 to 13 | 174 to 216 | ON | 88.5 to 106.5 |
| | UHF | 14 to 83 | 470 to 890 | OFF | — |
| Cable TV | VHF Low Band | 2 to 6 | 54 to 88 | OFF | |
| | CATV Midband | A-5 to 1 | 90 to 174 | OFF | — |
| | VHF High Band | 7 to 13 | 174 to 216 | OFF | |
| | Superband | J to W | 216 to 300 | OFF | — |
| | Hyperband | W + 1 to W + 58 | 300 to 648 | OFF | — |
| | FM | — | 88 to 108 | — | — |

When signals having frequencies within the terrestrial television broadcasting channel six or the VHF high band are received, the trap circuit control voltage $V_f$ is applied via the first feeding resistor 17 from the integrated circuit 4 to the trap circuit 5. Since the switch diode 15 is reverse-biased, the switch diode 15 inhibits current flow from node 5b to node 5a and thus is switched off. Accordingly, the trap circuit 5 attenuates a signal of a particular frequency when switch diode 15 is switched off, such as 91.25 MHz, within the FM broadcast-band.

When signals having frequencies within the terrestrial television broadcasting VHF low band, apart from the band of channel six, are received, the trap circuit control voltage $V_f$ is not applied to the trap circuit 5 and the band selection voltage $V_{hi}$ or $V_{lo}$ is applied to the VHF antenna tuning circuit 6. Since the switch diode 15 is forward-biased, the switch diode permits current flow from node 5b to node 5a and thus the switch diode 15 is switched on. Therefore, since the input terminal 5a and the output terminal 5b of the trap circuit 5 are short-circuited, high frequency signals are received by the VHF antenna tuning circuit 6 without being attenuated by the trap circuit 5.

When CATV signals are received, the trap circuit control voltage $V_f$ is not applied to the trap circuit 5 and the band selection voltage $V_{hi}$ or $V_{lo}$ is applied to the VHF antenna tuning circuit 6. Since the switch diode 15 is forward-biased, the switch diode 15 is switched on. Therefore, since the input terminal 5a and the output terminal 5b of the trap circuit 5 are short-circuited, CATV signals within the entire VHF band are passed to the VHF antenna tuning circuit 6.

Figure 2:
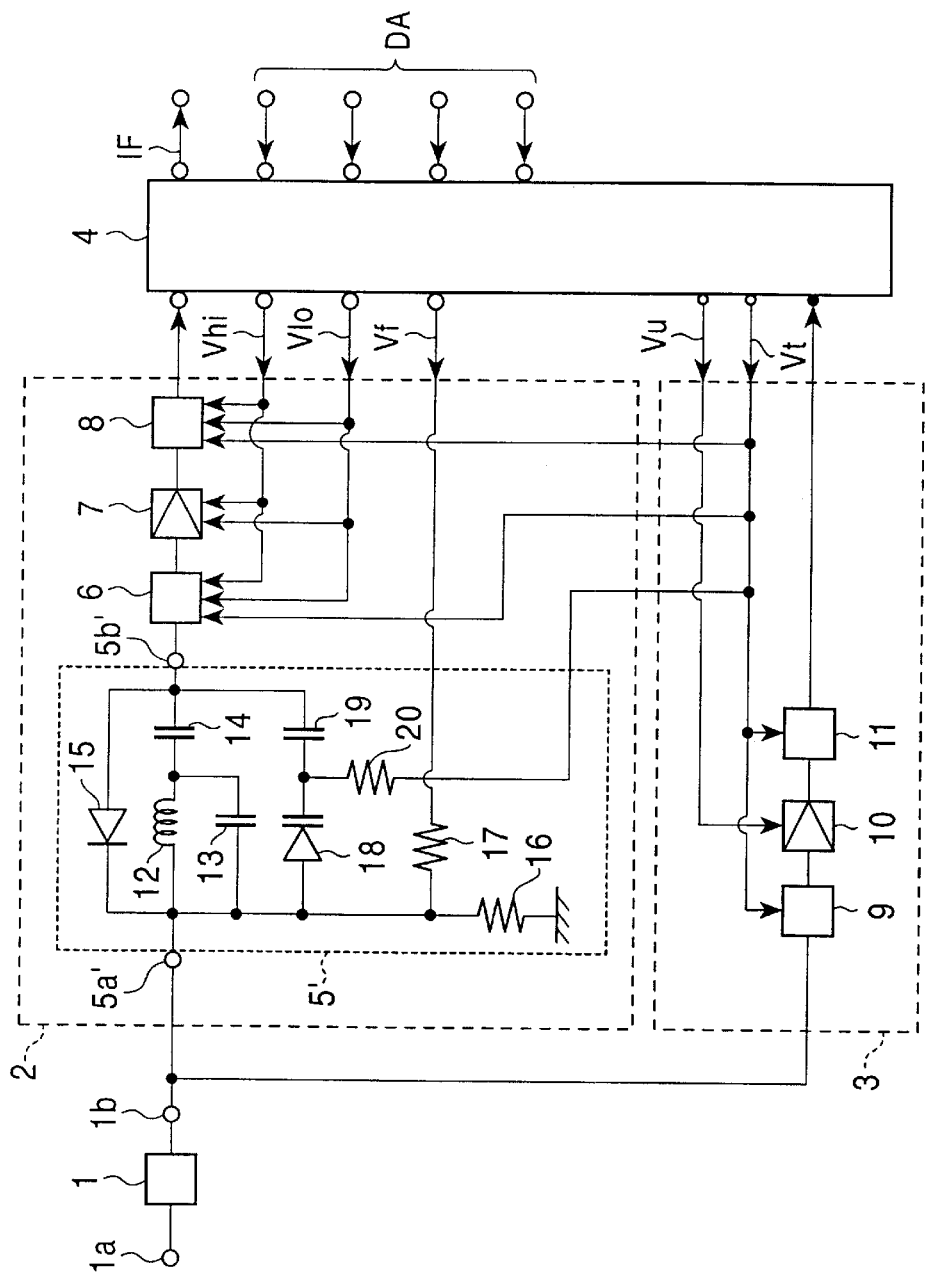
FIG. 2 is a block diagram of another television signal receiving tuner according to the present invention.
Figure 3:
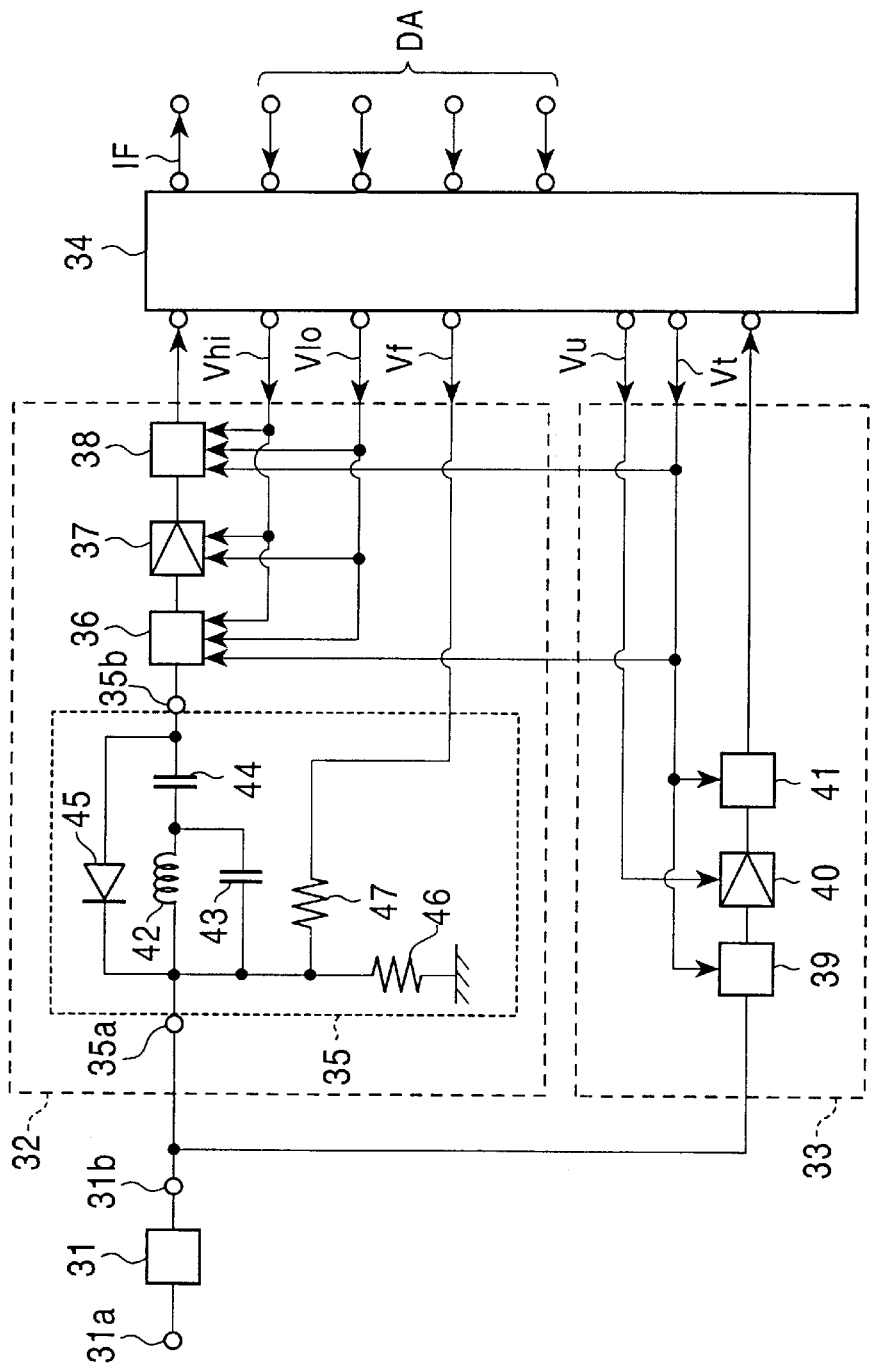
FIG. 3 is a block diagram of a conventional television signal receiving tuner.

FIG. 2 shows a preferred embodiment of the television signal receiving tuner according to the present invention. In this preferred embodiment, a trap circuit 5' can be tuned (also referred to as programmed) by a using a tuning voltage that tracks signals having frequencies to be attenuated. The trap circuit 5' can be tuned to attenuate FM broadcast signals which interfere with terrestrial television broadcast signals that are received by the tuner. The parallel resonant circuit formed by an inductor 12 and a first capacitor 13 is coupled, via a direct current blocking capacitor 14, in parallel with a switch diode 15, the cathode of which is connected to an input terminal 5a' of the trap circuit 5 and the anode is connected to an output terminal 5b' thereof. The cathode of the switch diode 15 is grounded via a resistor 16 provided between the input terminal 5a' and ground. A trap circuit control voltage $V_f$ is applied via a first feeding resistor 17 from an integrated circuit 4 to a node between the switch diode 15 and the resistor 16. Furthermore, the cathode of a varactor diode 18 is coupled with one terminal of a second capacitor 19, the anode thereof is coupled with the input terminal 5a' of the trap circuit 5', and the other terminal of the second capacitor 19 is coupled with the output terminal 5b' of the trap circuit 5'. A tuning voltage $V_t$ is applied via a second feeding resistor 20 from the integrated circuit 4 to a node between the varactor diode 18 and the second capacitor 19. Since the capacitance of the varactor diode 18 is varied by the tuning voltage $V_t$, the attenuation frequency of the trap circuit 5' is varied.

When signals having frequencies within or adjacent to the terrestrial television broadcasting channel, such as channel six, for example, or other VHF high band signals that are received, the trap circuit control voltage $V_f$ is applied to the trap circuit 5' via the first feeding resistor 17 from the integrated circuit 4. Since the switch diode 15 is reverse-biased, the switch diode 15 is switched off. By applying a tuning voltage $V_t$ to the varactor diode 18 corresponding to a channel to be received, the capacitance of the varactor diode 18 is varied. The capacitance of varactor diode 18 tunes the trap circuit 5' to a predetermined frequency. Signals at this predetermined frequency are attenuated by the trap circuit 5'. When signals having frequencies within channel six are received, the trap circuit 5' attenuates signals having a frequency near 91.25 MHz. When signals having frequencies within the VHF high band are received, the trap circuit 5' attenuates signals having a frequency which is half of the center frequency of a channel to be received. The tuning voltage $V_t$ also causes the tuning frequency of a VHF antenna tuning circuit 6 and that of a VHF interstage tuning circuit 8 to change. When VHF high band signals are received, the tuning frequencies of the VHF antenna tuning circuit 6 and those of the VHF interstage tuning circuit 8 range from 174 MHz to 216 MHz, and the trap circuit 5' is set so that the attenuated frequency varies between about 88.5 MHz and about 106.5 MHz.

When signals having frequencies within the terrestrial television broadcasting VHF low band, apart from the band of channel six, are received, the trap circuit control voltage $V_f$ is not applied to the trap circuit 5' and a band selection voltage $V_{hi}$ or $V_{lo}$ is applied to the VHF antenna tuning circuit 6. Since the switch diode 15 is forward-biased, the switch diode 15 is switched on. Since the input terminal 5a' and the output terminal 5b' of the trap circuit 5' are short-circuited, high frequency signals are received by the VHF antenna tuning circuit 6 without being attenuated by the trap circuit 5'.

When CATV signals are received, the trap circuit control voltage $V_f$ is not applied to the switch diode 15 and the band selection voltage $V_{hi}$ or $V_{lo}$ is applied to the VHF antenna tuning circuit 6. Since the switch diode 15 is forward-biased, the switch diode 15 is switched on. Therefore, since the input terminal 5a' and the output terminal 5b' of the trap circuit 5' are short-circuited, CATV signals having frequencies within the entire VHF band are received by the VHF antenna tuning circuit 6.

What is claimed is:

1. A television tuner capable of receiving television signals, said television tuner comprising a trap circuit comprising a parallel resonant circuit in parallel with a switch diode in parallel with a varactor diode, the trap circuit attenuates a frequency-modulation broadcast band of signals when, said television signals are in proximity to said frequency-modulation broadcast band, and when said television signals have a frequency within a range that is double the frequency of said frequency-modulation broadcast-band received by said television tuner.

2. A television tuner according to claim 1, wherein a resonate frequency of said trap circuit is varied in accordance with a channel of said television signals that has a range of frequencies that is double the frequencies of said frequency-modulation broadcast-band received by said tuner.

3. A television tuner according to claim 2, wherein said varactor diode is configured to receive a tuning voltage that varies the resonate frequency of said trap circuit.

4. A television tuner according to claim 3, wherein said switch diode block current flow only when said television signals are in proximity to said frequency-modulation broadcast-band and when said television signals are at a frequency that is about twice the frequency of the frequency-modulation broadcast-band received by said tuner.

5. A control circuit that attenuates television signal interference, comprising:
   a tuning circuit that generates a tuning signal;
   a television trap circuit comprising a parallel resonant circuit in parallel with a switch diode, in parallel with a varactor diode, the television trap circuit being coupled to said tuning signal;
   wherein said television trap circuit is configured to receive a composite signal that includes at least one television signal and at least one interference signal; and
   wherein said tuning signal selects a resonate frequency of said television trap circuit such that said resonate frequency of said television trap circuit is near the frequency of said interference signal.

6. The control circuit according to claim 5, wherein the trap circuit further comprises an output and a reactive component connected in series between said varactor diode and said output.

7. The control circuit according to claim 6 further comprising a linear component that is interconnected to said varactor diode, to said parallel resonant circuit, and to said tuning circuit.

8. The control circuit of claim 5, wherein said parallel resonate circuit comprises a reactive component.

9. The control circuit of claim 8, wherein said reactive component comprises a capacitor.

10. The control circuit according to claim 5, wherein said television signal comprises a band of television signals; said interference signal comprises a band of frequency-modulation signals that are in proximity to said band of television signals; and said resonate frequency of said trap circuit is a range of resonate frequencies that coincide with said band of frequency-modulation signals.

11. The control circuit according to claim 5, wherein said television signal comprises a band of television signals; said interference signal comprises a band of frequency-modulation signals that are within a range of frequencies that are approximately one half of the frequencies of said band of television signals; and said resonate frequency of said trap circuit is a range of resonate frequencies that coincide with said band of frequency-modulation signals.

12. The control circuit of claim 7, wherein said linear component comprises a resistor.

13. A control circuit that attenuates television signal interference, comprising:
   a tuning circuit that generates a tuning signal;
   a trap circuit comprising a parallel resonant circuit in parallel with a switch diode, in parallel with a varactor diode;
   wherein said trap circuit is configured to receive a signal that includes at least one interference signal; and
   wherein said tuning signal selects a resonate frequency of said trap circuit that is near the frequency of said interference signal.

14. The control circuit of claim 13, wherein said tuning signal is coupled to said varactor.

15. The control circuit of claim 13, wherein said parallel resonate circuit comprises a tank circuit.

16. The control circuit of claim 15, wherein said parallel resonate circuit comprises a tank circuit coupled to a reactive component.

* * * * *